(12) United States Patent
Jones et al.

(10) Patent No.: US 6,593,534 B2
(45) Date of Patent: Jul. 15, 2003

(54) PRINTED WIRING BOARD STRUCTURE WITH Z-AXIS INTERCONNECTIONS

(75) Inventors: Gerald W. Jones, Apalachin, NY (US); John M. Lauffer, Waverly, NY (US); Voya R. Markovich, Endwell, NY (US); Thomas R. Miller, Endwell, NY (US); James P. Paoletti, Endwell, NY (US); Konstantinos I. Papathomas, Endicott, NY (US); James R. Stack, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 09/812,261

(22) Filed: Mar. 19, 2001

(65) Prior Publication Data

US 2002/0131229 A1 Sep. 19, 2002

(51) Int. Cl.$^7$ .................................................. H01R 9/09
(52) U.S. Cl. ........................ 174/262; 174/263; 174/255; 361/772
(58) Field of Search ................................ 174/262, 263, 174/264, 265, 255; 361/772; 439/65, 66; 430/318; 29/825, 829

(56) References Cited

U.S. PATENT DOCUMENTS

| | | | | |
|---|---|---|---|---|
| 4,612,083 A | | 9/1986 | Yasumoto et al. | |
| 5,576,519 A | * | 11/1996 | Swamy | 174/264 |
| 5,744,285 A | * | 4/1998 | Felten et al. | 430/318 |
| 5,867,898 A | * | 2/1999 | Lauffer et al. | 174/263 |
| 5,902,118 A | | 5/1999 | Hübner | |
| 5,956,843 A | | 9/1999 | Mizumoto et al. | |
| 6,245,696 B1 | * | 6/2001 | Haas et al. | 174/259 |

OTHER PUBLICATIONS

R. L. Hollis, Jr. (1990), "Automatic Method for Registration and Stacking of Laminates," *IBM Technical Disclosure Bulletin*, vol. 33, No. 7.

E.W. Mace (1984), "Multilayer Subsurface Circuit Board Constructions", *IBM Technical Disclosure Bulletin*, vol. 27, No. 5.

* cited by examiner

*Primary Examiner*—Albert W. Paladini
(74) *Attorney, Agent, or Firm*—Scully, Scott, Murphy & Presser; William H. Steinberg, Esq.

(57) ABSTRACT

A structure of and method for producing a multilayer printed or wiring circuit board, and more particularly a method producing so-called z-axis or multilayer electrical interconnections in a hierarchial wiring structure in order to be able to provide for an increase in the number of inputs and outputs (I/O) in comparison with a standard printed wiring board (PWB) arrangement, and a printed wiring board produced by the method.

45 Claims, 6 Drawing Sheets

PRINTED WIRING BOARD STRUCTURE WITH Z-AXIS INTERCONNECTIONS

BACKGROUND OF THE INVENTION

1. Field of the Invention

The present invention relates to a method for producing a multilayer printed or wiring circuit board, and more particularly pertains to a method producing so-called z-axis or multilayer electrical interconnections in a hierarchial wiring structure in order to be able to provide for an increase in the number of inputs and outputs (I/O) in comparison with a standard printed wiring board (PWB) arrangement.

As the complexity of printed wiring boards increases, the need to increase the wiring density on each inner layer becomes more critical. Many complex PWB's currently have wiring grids of 1.0 mm (40 mil). Future applications will drive the need to extend that wiring grid to 0.50 mm or less. This drives the need for smaller line widths and line spacings, as well as smaller wiring vias on the inner layers and external wiring surfaces circuit board as the wiring grid (pitch) decreases. Consequently, smaller via holes must be drilled throughout the length of the PWB, thereby presenting the challenge of very high aspect ratios (PWB thickness divided by via diameter) and the required processing to form such vias. The vias also consume valuable areas or so called real estate on the inner layers of the PWB's which otherwise could be used for wiring density at more relaxed ground rules.

A PWB manufactured with a hierarchical design, could employ the use of innerlayers at varying wiring pitches which, when stacked together, produce the required wiring grid. In addition, if wiring vias are only extended through the length of the board for which an electrical connection for that wiring net is needed, the real estate normally consumed by the vias extending throughout the length of the PWB is now opened and available for circuit traces.

The concept for utilizing hierarchical electrical connections for multilayer printed wiring board structures which include substrates comprised of a dielectric material, such as an organic laminate, is known in the technology in that various electrically conductive elements are inserted into the interconnecting via or holes formed in the respective layers of the laminate, so as to enable the formation of electrical connections with the components intermediate some or all of the various layers, as may be required.

The manufacture and employment of multilayer printed wiring boards which include pluralities of conductive wiring layers intermediate dielectric layers conducive to forming a laminated structure is well known in the technology and in industry. In particular, the formation of lands for connection on the wiring layers and the forming of through holes or vias which extend through substantially one layer, or some or all of the layers of the printed wiring board dielectric material layers, and the coating of the vias with electrically conductive material so as to produce interlayer connections is also widely known.

In order to provide for the interconnection of the electrical components located on the surfaces of opposite sides of a layer, and/or the surfaces of additional layers of a multilayer printed wiring board, it is imperative that appropriate alignment be effected among the various holes or vias extending through respective superimposed layers of the laminate forming the printed wiring board, and to thereby be able to provide for appropriate interlayer electrical interconnections in an assured operative manner upon the filling of the vias or holes with an electrically conductive material, preferably such as a conductive paste.

2. Discussion of the Prior Art

Mizumoto et al U.S. Pat. No. 5,956,843, which is commonly assigned to the assignee of the present application, pertains to a multilayer printed wiring board and method of making thereof, in which a substrate constituted of a plurality of dielectric layers having electrically connecting components formed on the surfaces thereof so as to be either arranged externally or internally intermediate adjacent layers, and which are provided with vertically aligned through-holes or vias communicating between adjacent layers. Each of the holes may be equipped with electrically conductive plated layers or similar structures covering the surfaces of the holes or vias, and a conductive or non-conductive material, such as in the form of a paste, may be filled into each plated hole. Although the foregoing method of production and resultant structure set forth in this publication is generally satisfactory, the present invention improves thereon by essentially reducing manufacturing costs for such laminated printed wiring board structures incorporating multilayer arrangements with electrical interconnections, which in essence will permit the obtaining of higher processing yields under optimal economic manufacturing conditions. Higher yields will result from processing the individual layers within the capabilities and physical limitations. Also, because each layer can be processed in parallel, the individual layers could be fully tested prior to being laminated into a large multilayer board.

Yasumoto et al U.S. Pat. No. 4,612,083 discloses a process of fabricating three-dimensional semiconductor devices in which various laminated layers of a multilayer structure facilitate the formation of various electrical conductive interconnections in each of the respective layers, which are superimposed and laminated to each other. This entails a relatively complex manufacturing procedure, which although providing for appropriate electrical interconnects intermediate the various layers of the multilayer semiconductor device, requires extensive processing which appreciably increases the cost of manufacture.

Hübner U.S. Pat. No. 5,902,118 discloses a method of producing a three-dimensional circuit arrangement wherein various layers of a semiconductor device are interconnected through the utilization of metallic components arranged in communication with operatively aligned drilled holes formed in the respective layers. This construction is complex and, resultingly, difficult to align during manufacture and assembly, so as to be conducive to extensive manufacturing costs in forming the multilayer or stacked electric circuit arrangement.

IBM Technical Disclosure Bulletin, Volume 33, No. 7 December 1990, entitled "Automatic Method For Registration and Stacking of Laminates" sets forth a method for automatically registering stacking thin laminates which are utilized in printed circuit board manufacturing. Again, although this provides for a generally satisfactory method of registering and stacking layers of a thin laminate forming a semiconductor structure, the processing apparatus is extremely complex in requiring the utilization of expensive robotics in order to provide for accurately aligned positioning of the various electric components, interconnects and layers.

IBM Technical Disclosure Bulletin, Volume 27, No. 5 October 1984, entitled "Multilayer Subsurface Circuit Board Constructions" discloses the superposition of layers of a multilayer printed circuit board or wiring board, wherein metallic electrically conductive pins are inserted through aligned holes or vias previously formed in the layers, and wherein the holes are then at least partly filled with a conductive paste so as to provide for the interconnections of the electrical components arranged on internal and external layers of the laminated substrate forming the printed or wiring circuit board.

SUMMARY OF THE INVENTION

In essence, the present invention improves upon the prior art by providing a method and structure for creating z-axis interconnections in a high density wiring structure of a multilayer printed or wiring circuit board which will considerably increase the number of inputs and outputs (I/O) feasible in comparison with those of a standard wiring board design.

Basically, the invention enables an improved and simplified processing in the manufacture of such laminated multilayer printed wiring boards (PWBs) with higher I/O yields, in that each respective layer is individually processed at optimum conditions for a particular thickness for each such layer. In that instance, each layer has the required hole or arrays of holes or vias formed therein. The respective vias in each of these layers are filled to facilitate electrical interconnections with regard to components or wiring arranged on opposite sides of the layers or with components and wiring on an adjacent layer or surface upon lamination therewith so as optimize the manufacturing processes in a highly economical and efficient manner. The vias in the structure could also conceivably be filled during the lamination process by using a conductive material which is coated on a carrier that is pushed into the holes either selectively with a mask or non-selectively.

In particular, the invention facilitates the thickness of each layer to be governed by the aspect ratio drilling which is required, and enables the thickness of the layers, which may be constituted of either simple signal layers or multilayer panels, to be tailored to the drilling or other hole or via producing process which is optional for the diameter and panel thickness of the printed wiring board.

The present invention solves manufacturing and cost problems encountered in the industry, the latter of which includes additional thin layers being imparted to a printed wiring board, and keeps down the layer count and thickness in comparison with the state-of-the-art while obtaining a higher I/O yield. This is desirable, inasmuch as when the thickness of the printed wiring board is increased, it becomes increasingly difficult to effect a high aspect ratio processing for z-axis or multilayer interconnections, in effect, plated through-holes (PTHs), as well as plated copper surface thicknesses for circuitization. The present invention is not subject to these particular limitations, inasmuch as the process of producing the holes in each layer is implemented in thinner single layers prior to lamination of the individual layers of the printed wiring board.

Moreover, inasmuch as each of the holes or vias provided in each layer for forming the essentially multi-surfaced electrical interconnections is filled with a conductive paste, practically no or extremely little plating is required for the holes in order to produce the through-extending electrical connections, thus enabling any external circuitization to be as fine or dense as may be required by particular physical applications and customer needs. This, in particular, significantly reduces production time, in view of the potential elimination in the need for hole or via plating.

Accordingly, it is an object of the present invention to provide a novel and simplified method of producing a multilayer printed wiring board structure with z-axis interconnections.

Another object of the present invention is to provide a method of forming a structure for a laminated multilayer printed wiring board having circuitized surfaces and which are electrically interconnected by a plurality of aligned holes or vias which are formed pass through one or more of adjoiningly superimposed laminated layers of the printed wiring boards, and which holes are each filled with an electrically conductive paste which essentially forms the required intersurface and interlayer electrical connections.

Yet another object of the present invention is to provide a structure consisting of a laminated multilayer printed wiring board having interlayer electrical interconnects affected through vias which are filled with a conductive paste, and wherein the laminates form the necessary structure for a desired density in the number of electrical inputs and outputs.

Still another object of the present invention is to provide a structure consisting of a laminated multilayer printed wiring board having interlayer electrical interconnects effected through vias which are filled with a nonconductive paste, and wherein the vias in each of the innerlayers is overplated with another layer of metallization, such that a pad is formed upon which a conductive adhesive is dispensed which, after joining, forms the necessary structure for a desired density in the number of electrical inputs and outputs.

It is to be understood that the present invention offers the flexibility of creating many different interlayer connections and resultant structures that will become readily apparent to those skilled in the art.

BRIEF DESCRIPTION OF THE ACCOMPANYING DRAWINGS

Reference may now be made to the following detailed description of the preferred embodiments of the invention, taken in conjunction with the accompanying drawings, in which.

DETAILED DESCRIPTION OF PREFERRED EMBODIMENT

Figure 1:
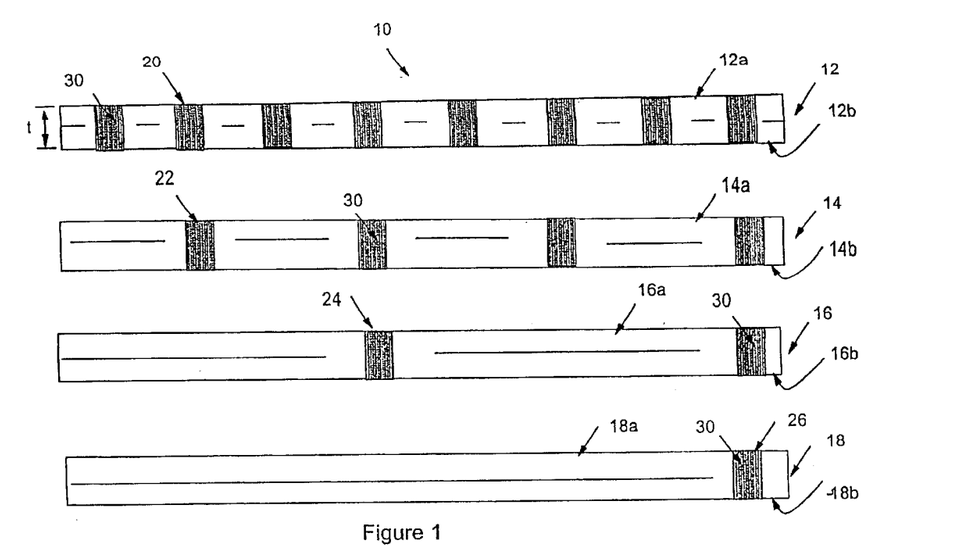
FIG. 1 illustrates, in a generally diagrammatic representation, separate individual layers of a printed wiring board (PWB) pursuant to the invention, prior to lamination thereof.

Referring now in detail to the drawings, and more specifically to FIG. 1, for the formation of a multilayer printed wiring board 10, there is illustrated a plurality of separate layers 12, 14, 16 and 18, in this instance, by way of example, consisting of a total of four layers. Each of the layers is constituted of an essentially dielectric material, such as an organic substrate, as is well known, and may be equipped on their respective opposite surfaces 12a, 12b; 14a, 14b; 16a, 16b; and 18a, 18b with suitable circuitized plating and/or wiring. This may be selectively applied either with or without a mask, as is well known in the technology. Each of the layers 12, 14, 16 and 18 may possess a thickness "t" of preferably, but not necessarily, within the range of about 20–100 mils, depending upon the sizes of holes or vias to be formed therein.

Formed respectively in each of the layers 12, 14, 16, 18 prior to lamination thereof, are a plurality of through extending holes or vias 20, 22, 24, 26, wherein each of the layers may have a different array or number of holes formed therein depending upon how the opposite surfaces of each layer and superimposed layers are to be electrically interconnected. Thus, for example, the uppermost layer 12 may be provided with the largest number of through-holes or vias 20, whereas the adjoining layer 14 may have a fewer number of holes 22, with the subsequent layers 16 and 18 having even fewer numbers of holes 24 and 26, although it is contemplateable that the reverse may be in order pursuant to the invention.

The holes 20, 22, 24, 26 of the successively superimposed layers 12, 14, 16, 18 are drilled so as to be in axial alignment with each other. Thus, for instance, the holes 20 in the uppermost layer 12 provide electrical connections with electrical components on opposite surfaces 12a and 12b of layer 12, but only some to surface 14a and select holes 22 formed in the second layer 14, whereas the holes 22 in the second layer 14 provide connections with surface 14b and holes 24, and also to the third layer 16, and the holes in the third layer also provide connection to the hole 26 formed in the fourth layer 18, similarly as described in connection with the uppermost layer 12.

Figure 2:
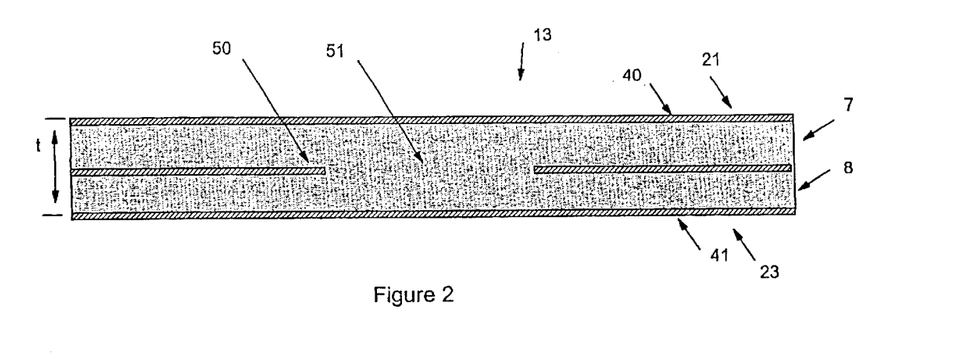
FIGS. 2 to 12 illustrate, respectively, the various aspects of the sequential method steps employed for the construction of the layers of the printed wiring board.

The formation of the individual layers as shown in FIG. 1 is now discussed hereinbelow. As illustrated in FIG. 2 of the drawings, there is disclosed a basic layer 13, that represents the starting building structure for layers 12, 14, 16, & 18 in FIG. 1. Layer 13, in this instance, has a thickness "t" and is herein substantially shown as a multi-layer element having one internal element but it is to be understood that this layer could have zero internal elements up to any numbers, as required by the physical design. However, since it is the intent of this invention to limit the aspect ratio of processes apertures to be added later, it is preferred to limit the internal elements to up to two for purposes of representation.

In FIG. 2, there is shown an electrically insulative base member 13 which may be used in the present invention to produced the final printed wiring board unitary structure. It is understood that the invention is not limited to the particular configuration shown in FIG. 2, as other configurations are readily possible. Base member 13 includes first and second conductive layers 40 and 41, which sandwich therebetween first and second dielectric layers 7 and 8 and conductive plane 50. In a preferred embodiment, each of the two conductive layers is comprised of copper or a well known conductive material, each having a thickness from about 0.25 mils (0.0025 inches) to about 3.0 mils with the thickness of each preferably being about 0.75 mils. Each of the two dielectric layers is comprised of fiberglass reinforced epoxy resin (FR4) and each possesses a thickness of from about 2 mils to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, also may prevent the attainment of an optimum package electrical performance. In addition, it is the purpose of this invention to provide individual layers that enable optimal process yields by having physical limitations on items, such as aspect ratio.

Sandwiched between dielectric layers 7 and 8 is the conductive plane 50, preferably of copper or other well-known conductive material, and possessing a thickness of preferably within the range of about 0.125 mils to about 3.0 mils. The thicknesses for plane 50 of less than about 0.125 mils may prove undesirable should the resulting structure by subjected to relatively high temperatures. Additionally, thicknesses greater than about 3.0 mils may prove undesirable because of the additional time necessary to form such layers using conventional plating techniques and associated difficulties with line width control. Also, the conductive plane 50, may be processed individually and handling thin layers may prove difficult.

As shown in FIG. 2, an area 51 is located within element 13. Area 51 is formed during personalization of conductive plane 50 prior to lamination of element 13. Such areas within a printed wiring boards are known in the industry as "clearance holes". If it is desired to provide electrical contact between a feature on surface 21 and surface 23 without contacting the internal plane 50, then a clearance must be provided in plane 50. The clearance will have a diameter substantially larger than an aperture which is to be subsequently created, such that tolerances in the process of making the aperture will not make contact. It is also understood that if one desires to provide a conductive path from one of the surfaces to an internal plane, no clearance holes are provided.

The resulting structure shown in FIG. 2 thus preferably possesses a thickness within the range of about 4.7 mils to about 44 mils. More preferably, a thickness of about 8 mils is used.

Conductive layers 40 and 41 and dielectric layers 7 and 8 are bonded to the conductive plane 50 using a lamination process, such a process being known in the art so that further description is not necessary for an understanding thereof Base member 13 is thus shown to include at least two surfaces, a first surface 21, and a second surface 23.

Although two conductive layers and two dielectric layers are shown for base member 13, it is to be understood that the invention is not limited thereto. Specifically, it is only necessary to provide one such conductive layer and one such dielectric layer while still attaining the advantageous results taught herein. At least two layers of each are used when it is desired to incorporate an internal conductive plane (e.g., power, ground or signal) as part of the final structure. Understandably, several conductive dielectric layers and corresponding internal conductive planes may be utilized, depending upon operational requirements for the finished product.

Figure 3:
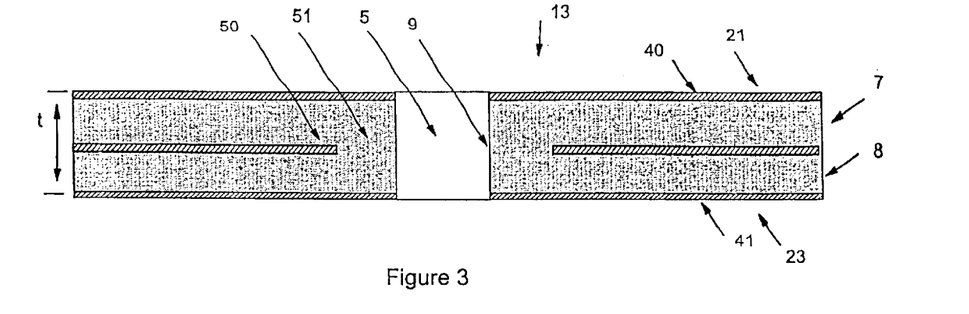

Referring to FIG. 3, opening 5 having a internal wall 9 is formed to extend substantially through base member 13. Although only one opening is shown formed in base member 13, it is understood that multiple openings may be formed in base member 13 depending upon the ultimate electrical requirements of the circuitized substrate. Opening 5, preferably a hole, may be formed by mechanical drilling although other hole forming techniques, such as punching and laser drilling, can also be employed. Opening 5 is formed with a diameter of about 4 mils to about 14 mils, preferably about 8 mils. Opening 5 is also shown passing through the pre-formed clearance opening 51 whereby, it is understood by those skilled in the art of holemaking with regard to, dimensional stability and registration, that opening 5 may be offset from a center. The amount of offset is defined by the design, and frequently there are limitations to the amount of offset permitted. It is also understood that opening 5 may pass directly through the internal conductive plane 50.

The element or base member 13 as shown in FIG. 3, is employed because the base enabling structure is applicable to the preferred as well as to other embodiments of this invention.

Figure 4:
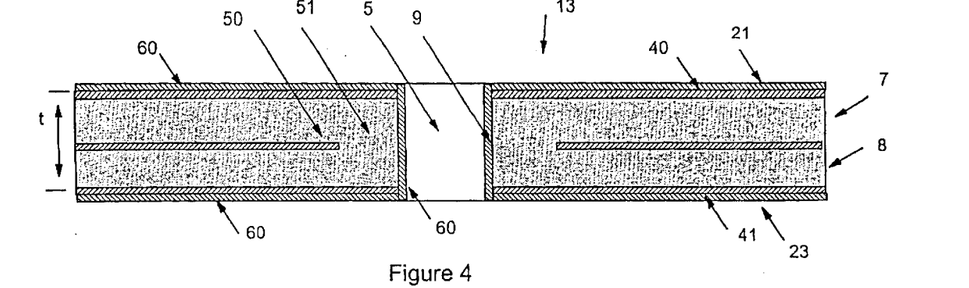

In the next step of the preferred embodiment as illustrated in FIG. 4, it is intended to provide a first electrically conductive layer 60 on the surfaces 21 and 23 of base member 13, respectively, and on internal wall 9 of opening 5. As seen in FIG. 4, this conductive layer 60 substantially covers the entire thickness of base member 13 and the surface of wall 9 in hole 5. The first electrically conductive layer 60 may be comprised of nickel, aluminum, or copper, but is preferably copper. The thickness of this first electrically conductive layer may be from about 0.3 mils to about 1.5 mils, and preferably about 0.8 mils to about 1.2 mils.

The first conductive layer is deposited by conventional plating methods such as electroplating, electroless plating, sputter, mag-ion or other techniques known in the industry. These methods may employ the use of an initial conductive layer (having a thickness of 10 to 60 angstroms), such as a seed layer which is comprised of particles consisting of palladium-tin particles in order to act as a catalyst for metal deposition. Furthermore, in a method such as electroplating, it is known in the industry that a very thin initial metal deposit (0.01 to 0.2 mil) is applied over the catalyst layer in order to create a electrical commoning layer. The other techniques may implement similar very thin layers, for deposition. Because of the multiplicity of techniques, the thin layers are not shown, only the major thickness first layer.

In the embodiment of this invention, an electroplating process is used.

After application of the first electrically conductive layer, the diameter of hole 5 is reduced from about 8 mils to about 6 mils and can be as small as about 2 mils to about 12 mils. The first conductive layer on hole wall 9 is essentially not the same thickness as the layer 60. There is an industry known phenomenon with plating called "throwing power", which substantially, it means the ability of the plating process to plate the first conductive layer in a via hole. It is represented as a percent of the thickness of the first conductive layer on hole wall 9 divided by the thickness of the first conductive layers on the first and second surfaces (i.e. 60). In the industry it is generally specified that the first conductive layer in the length of a via (i.e. 5) on the hole wall (9), be at a minimum thickness at any point along the wall. Most plating processes deliver less than 100% "throw" into the via holes (i.e. there is more copper plated on the surface than in the hole wall per unit time). The present invention facilitates the approach to obtaining 100% throwing power throughout the opening 5, by limiting the aspect ratio.

Since the subsequently described interlayer connection technique involves joining of the individual elements there is a need to provide internal support to adjoined layers over internal openings. This cannot be done successfully in the industry with a standard lamination fill process whereby excessive resin from the dielectric material flows into the opening during the lamination cycle. Filling the hole with a resin material only will provide a mismatch in the coefficient of thermal expansion that could reduce package reliability after joining. It is therefore necessary to substantially fill the openings with a permanent material, which can be conductive or nonconductive. This may be performed using a material which is matched to the coefficient of thermal expansion of the base member and compatible with a previous metal plating bath, such as filled epoxy resin based material as described in Bhatt '844. Conductive materials such as silver based conductive adhesive pastes are available commercially under the trade name Abelbond 8175 from Ablestick and CB100 available from the E. I. duPont DeNemours Corporation under this trade designation. Two common techniques are available for introducing the fill material into the plated through-lamination or screening, although other injection methods are also available. If there are plated through holes that are to remain unfilled (tooling holes, alignment holes, etc.) a selective method such as that described in Bhatt U.S. Pat. No. 5,487,218 may be used. Other methods could be introduced to improve the adhesion of the fill material, such as subsequent metallization of nickel, gold, palladium, etc., or treatment of the copper with an oxide process (e.g. chlorite). These methods are known in the industry and no further explanation is required.

Figure 5:
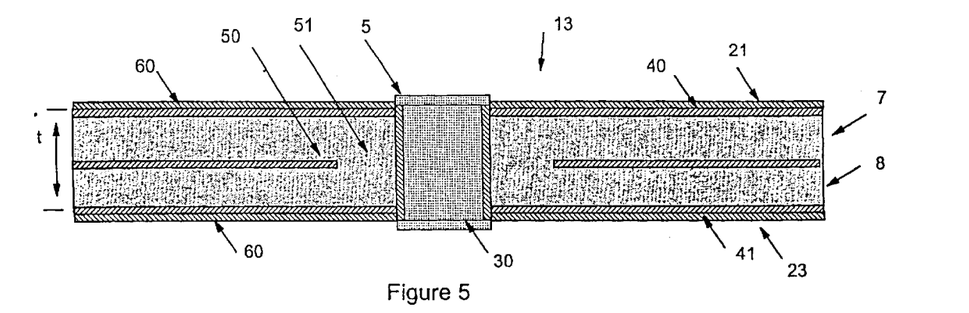

FIG. 5 illustrates the resultant structure after substantially filling opening 5 with the permanent material 30. The opening is filled such that the external surfaces of the filled opening are substantially planar with the first conductive layer 60 on the base layer 13, yielding a planar surface for subsequent photolithographic and joining processing, as described hereinbelow. However, as FIG. 5 shows, there may be excessive fill material present above the surface plane.

Figure 6:
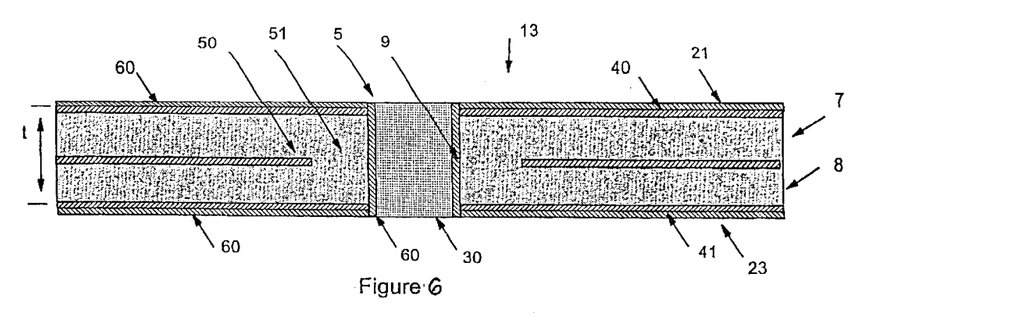

FIG. 6 shows the resultant surface described above after a planarization step, such as mechanical or chemical polishing, has been performed. These methods are known in the industry and further detailed description thereof is not needed.

Figure 7:
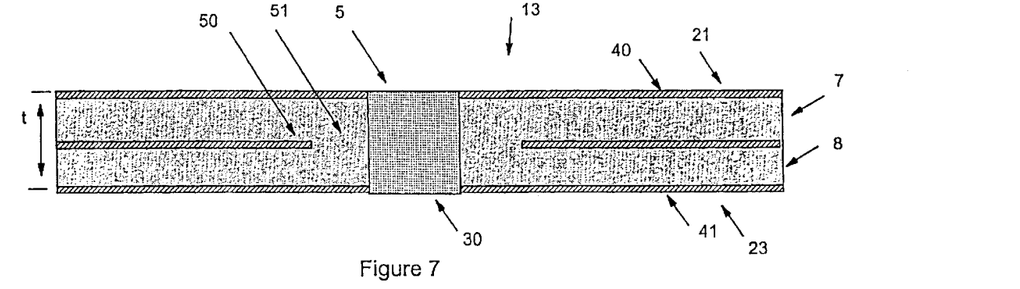

FIG. 7 represents a second embodiment of the present invention at the equivalent state in the processes. In this second embodiment, conductive layer 60 has not been applied to member 13. Thus the internal walls of opening 5 do not have metallization when filled with the permanent filler material described above. In this embodiment, the preferred filler material would be conductive such that it provides an electrical connection from the top surface to the bottom surface. Hole wall 9 is in direct contact with the filler material. If it is desired to have a connection with plane 50, there would be a direct contact of the filler material with plane 50.

To one skilled in the art, it is possible to create other intermediate structures such as those having metallization on the internal walls of the opening 5, only without applying the metallization to the top and bottom surface, or substantially remove metallization such as described in copending appln. No. 09/345,573; Attorney Docket EN998113, "Fine Pitch Circuitization with filled PTH's". These intermediate structures are design dependent and individual layers may require different design rule applications.

Figure 8:
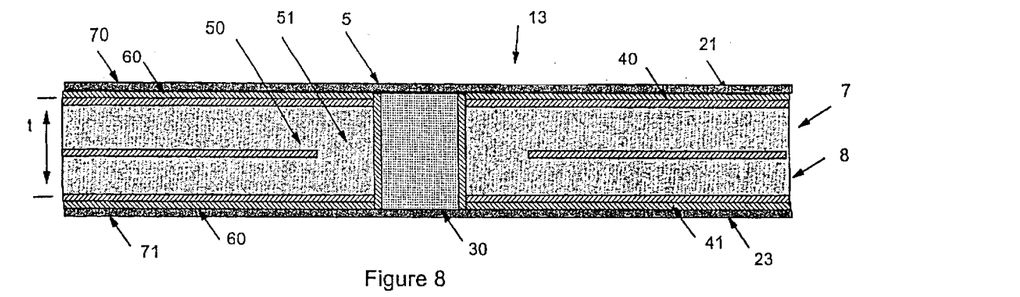

As represented in FIG. 8 layers of photoimaging (photoresist) material 70 and 71, are shown as being applied on the respective opposite surfaces of member 13. In one example, the layer of photoresist possesses a thickness of from about 0.3 mils to about 2.0 mils. A preferred material is a negative-acting photoresist, various examples being known in the art, including MI Series available from MacDermid Corp. under this trade designation, or Photoresist 3120 available from the E. I. DuPont deNumours Corporation under this trade designation. Negative-acting photoresists, when applied and exposed through a suitable photomask, undergo a physical and chemical change in the exposed areas that render these areas insoluble to the subsequent developing solution which is to be applied thereto.

Methods of exposing with the photomask are known in the industry and include contact and off-contact. This embodiment uses an off-contact method (i.e. projection) but it is understood that either method will work. Following exposure, the resist-coated base member 13 is immersed in developing solution (e.g., sodium carbonate or propylene carbonate), which allows the unexposed areas to be removed without excessive impact on the hardened, exposed area. Baking or other processes may be used to further harden the remaining, exposed portions, if desired.

Significantly, it can be ascertained that the plated through via is covered by the photoimaging layers 70 and 71and will provide (after removal of the photoresist) a complete and uninterrupted conductive layer around hole 5. In the industry, the photoimaging material must "tent" the plated through holes (if it is a liquid, it must coat the entire length of the hole wall). The thinner the applied photoimaging material, the better the resolution of exposed features. The use of thinner photoimaging materials (whether liquid or solid) to achieve fine line circuitization must be able to protect the plated via needing a conductive path from being etched. Opening 5, having a permanently filled hole, provides support for the photoresist. By having a plated via protected from etching, very thin photoimaging layers can be used because there is no concern for achieving a tent (or coating of the holewalls for a liquid). It also provides process robustness, where as the conventional tenting process, a broken or misregistered tent will allow etching. With this method, unless the photoimaging material is completely missing due to a process error, the conductive path is protected from etching.

Figure 9:
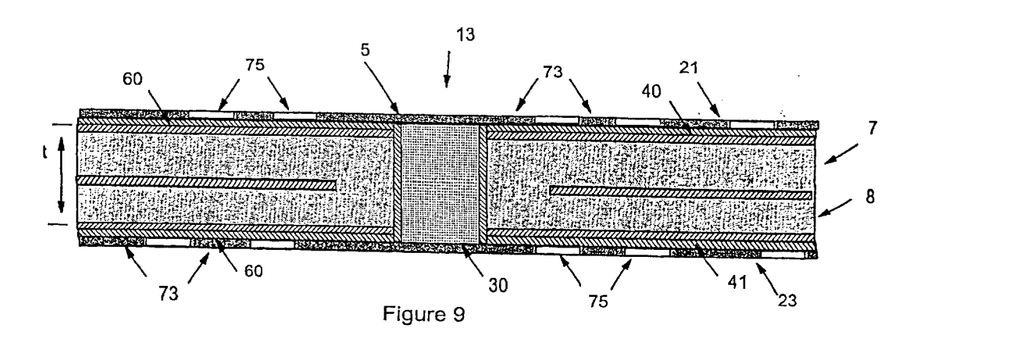

In FIG. 9, base member 13 is shown following the above exposure and removal (developing) operations. As such, only portions of photoresist layers 70 and 71 remain, thereby these portions are represented by the numeral 73. It is understood that the removed portions of the photoresist in turn result in openings 75 which, in turn, expose preselected areas on the respective surfaces on which circuitization is to eventually occur. Thus a predetermined pattern is provided on both surfaces.

Although a negative-acting photoresist procedure has been described, the invention is not limited thereto. It is also possible to instead thereof to use positive-acting photoresists in which the exposed areas thereof under the photomask, when immersed in the developing solution, are removed. It is thus ascertainable that the present invention is adaptable to more than one accepted technology.

Figure 10:
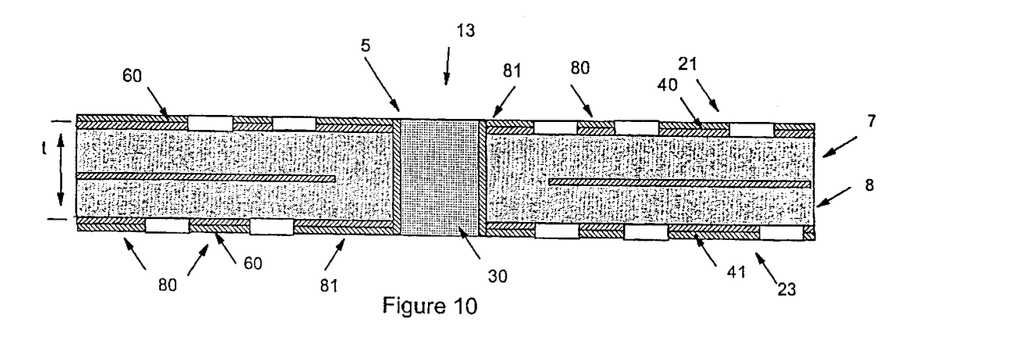

As shown in FIG. 10,member 13 has been subjected to an etching process in which copper or similarly conductive metal is removed in the exposed portions (e.g., site 75) which remain following photoresist development and the photoresist stripping process.

In a preferred embodiment, the exposed areas are removed by wet etching, which can be performed by known techniques in the art, preferably which cupric chloride or ferric chloride. Wet etching is well known in the art and further detailed description thereof not considered to be necessary. Wet etching of the exposed areas 75 substantially removes the exposed first electrically conductive layer 60 and conductive layers 40 and 41 leaving exposed portions of the first dielectric layer 7 and of the second dielectric layer 8. Non exposed portions 73 define a circuitized pattern on the first dielectric layer 7 and the second dielectric layer 8.

Additionally, the remaining portions of photoresist layer 70 and 71 are removed, preferably by stripping the photoresist with a suitable solvent known in the art, such as propylene carbonate, sodium carbonate, or sodium hydroxide. Other removal techniques such as laser ablation and mechanical removal or combinations thereof, may also be employed to remove the photoresist layer. In one example, the exposed areas of the first electrically conductive layer on the surfaces of base member 13 serve as one or more circuit traces or contact pad areas 80. In addition to the exposed contact pad areas, it is also possible to expose one or more areas 81 on base member 13, depending upon operational requirements for the final product. This area 81 is a land segment which, in turn, surrounds through hole 5 and may serve to interconnect upper and lower layers of circuitry and also internal conductive planes such as 19, if desired.

It is also understood that FIG. 10 will be the intermediate resultant structure based upon which embodiment the method is selected so as to arrive at either FIG. 6 or FIG. 7. It is this structure that will be used to accomplish the final joining and resulting unitary structure.

Figure 11:
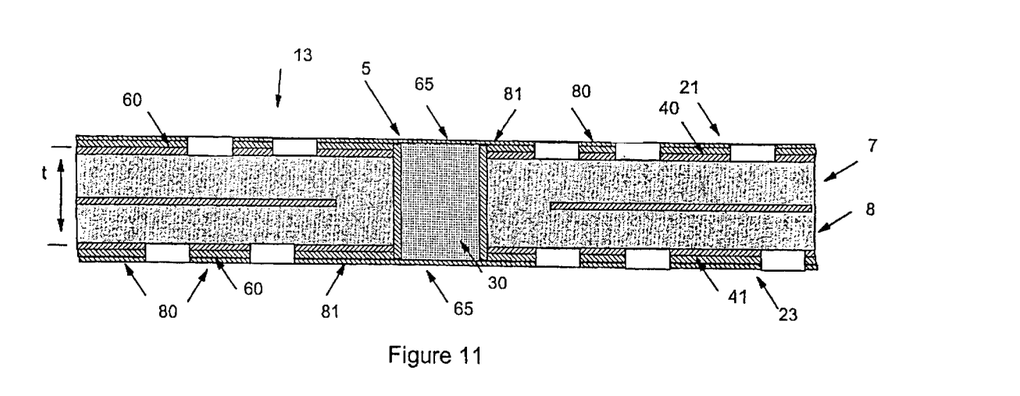

FIG. 11 represents another embodiment of the present invention. The structure formed for this embodiment was the result of a conductive layer 65, preferably copper, being plated over the entire member following the step illustrated in FIG. 6 and then subjected to processing as above. It is understood that one could perform the same second metallization step after FIG. 7. The advantage gained by this embodiment is that the fill material, after the second metallization step, is protected from exposure to subsequent wet chemistries. Depending upon the selected filler material, components of the filler material may be detrimental to subsequent wet chemistries or be attacked by those chemistries. Still another advantage gained by a second metallization, it that the filler material can be fully cured and made not to flow in subsequent thermal processing such as baking. Yet another advantage is that the land area 81 can be made relatively large. In subsequent joining steps, a conductive adhesive paste is dispensed over the land area 81. The land area provides a bigger target for registering the paste than the opening diameter itself. A smaller amount of paste can be used and squeezed out during lamination so as to be restricted to the pad, thus reducing the possibility of creating a conductive path to adjacent conductor features.

Figure 12:
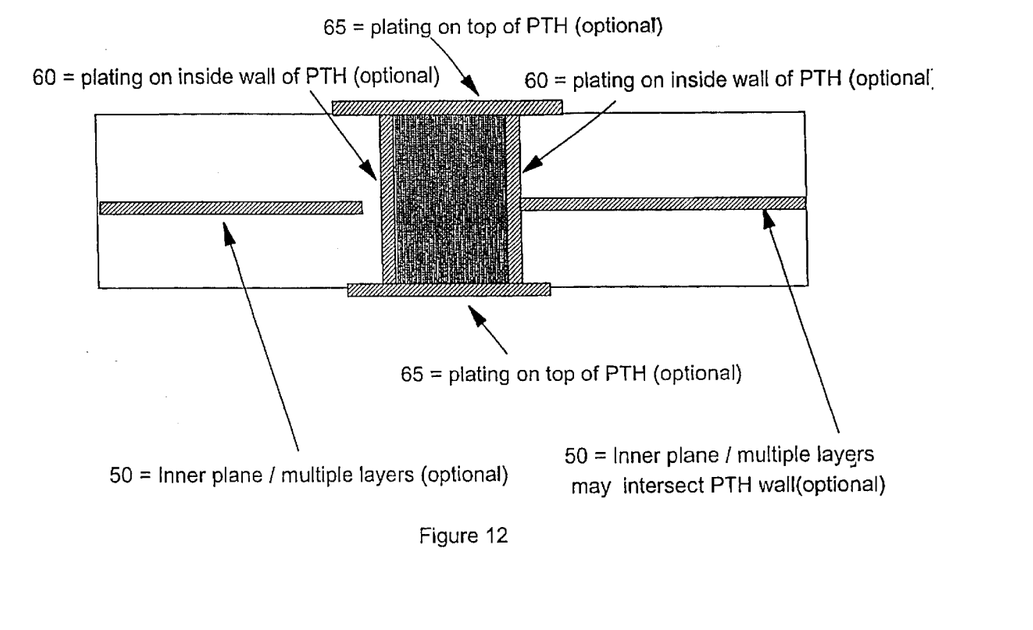

FIG. 12 illustrates a plurality of internal structures created by the above embodiments for the internal opening, whereby those skilled in the art will obviously ascertain which are mutually exclusive of each other.

The building blocks illustrated in FIGS. 10 and 11 thus become the layers needed to form the unitary structure. Layers 12, 14, 16 and 18 of FIG. 1 are formed by the above described methods, however, the present invention is not limited to the layers represented by 12, 14, 16 and 18.

Figure 13:
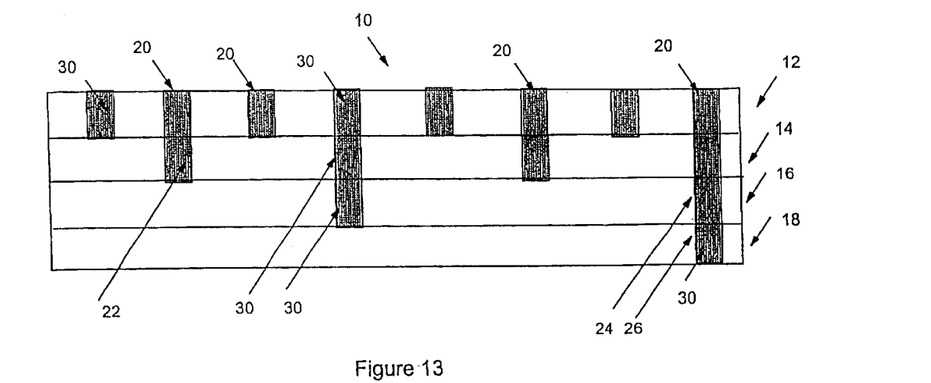
FIG. 13 illustrates the layers for the printed wiring board having been laminated so as to form a unitary structure.
Figure 14:
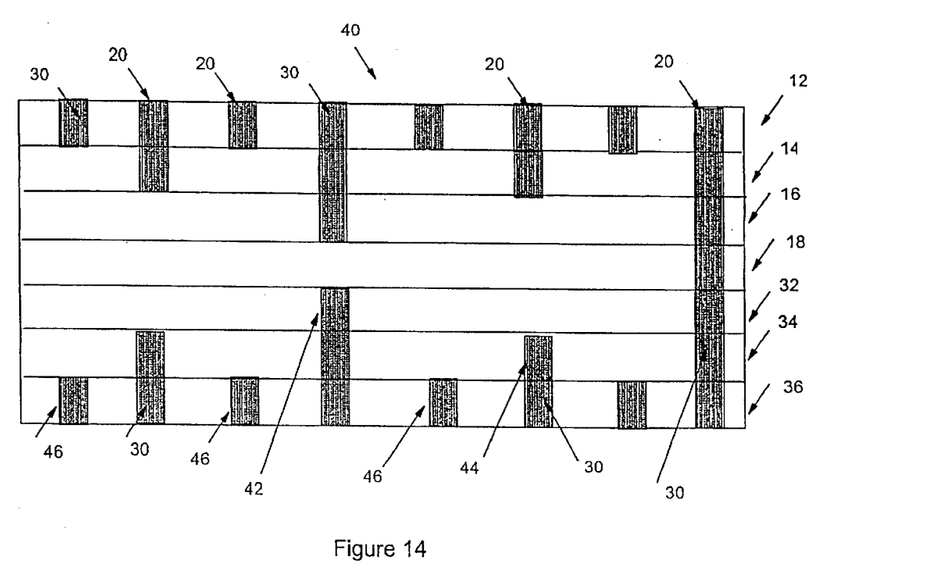
FIG. 14 illustrates the lamination of a plurality of layers of a printed wiring board in order to form a larger structure, as required, to provide a needed number of inputs and outputs (I/Os).

Illustrated in FIG. 13 of the drawings, prior to the individual layers 12, 14, 16, 18 being laminated together in order to form the unitary structure of the multilayer printed wiring board 10, the holes or vias 20, 22, 24 and 26 each have applied thereon an electrically conductive paste 30 such as of a copper composition, gold, or possibly a diamond dust paste; preferably an electrically conductive adhesive paste composition, such as those described above for a filler material. Such material is dispensed through methods known in the industry such as screening or stenciling. The conductive adhesive paste is dispensed such that a small amount is present on top of each previously filled via. The amount of the paste dispensed depends on the size of the via and the required registration. These areas of conductive paste will subsequently form the conductive interconnections between the contiguous surfaces of the layers 12, 14,

16, 18 upon their lamination. The layers are joined during the lamination process by compressing conductive paste material which is pushed between the pads or aligned holes forming a conductive path.

Further layers 32, 34 and 36, similar to, but by way of example only, shown as mirror-images of layers 12, 14 and 16, may be added as additional lamination to layer 18 as shown in FIG. 3, so as to provide a larger structure for a laminated printed wiring board 40 having the necessary interconnections, particularly through the further holes or vias 42, 44 and 46 which are aligned so as to form direct electrical interconnections between the intermediate, as well as the top and bottom layers of the device, and to produce a device as large as possible with as many laminated layers as may be required for the necessary number of inputs and outputs (I/Os).

The foregoing construction, due to its very simplicity provides for a unique method of inexpensively and reliably producing multilayer printed wiring or printed circuit boards at minimum cost and least complexity, with the primary consideration being given to that the various holes of the adjoining layers which are to from the interconnects be appropriately aligned with each other to ensure proper contacting. This type of structure enables the formation of as many inputs and outputs as are necessary, and as many laminated layers of the substrate as needed to form the printed wiring boards which are adapted to customized applications.

The advantages provided by the present invention will become readily apparent in the design flexibility and use of hierarchical electrical connections for multilayer printed wiring. This will provide high I/O counts through hierarchically stacking the layer needed to achieve them.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

What is claimed is:

1. A method of producing a laminated multilayer printed wiring board formed from a plurality of individual layers each comprised of a dielectric organic material so as to form z-axis electrical interconnections; said method comprising:

drilling through-holes in a predetermined array in a first said dielectric layer;

filling said through-holes with an electrically conductive paste;

drilling through-holes in a second array in at least a second said dielectric layer;

filling said through-holes in said second dielectric layer with an electrically conductive paste;

and laminating said first and second dielectric layers in superimposed surface contact whereby at least selective of the through-holes in said first dielectric layer are in alignment with selective of the through-holes in said second dielectric layer so as to cause the electrically conductive paste in said aligned holes to come into electrically conductive communication with each other.

2. A method as claimed in claim 1, wherein the number and array of holes in said first dielectric layer differs from the number and array of holes in said second dielectric layer.

3. A method as claimed in claim 2, wherein said second dielectric layer has fewer through-holes than said first dielectric layer.

4. A method as claimed in claim 1, wherein a third dielectric layer has a number of through-holes drilled therein in a specified array; comprising filling said through-holes with an electrically conductive paste; and laminating said third dielectric layer to a surface of said second dielectric layer distal from said first layer, whereby at least specified of the through-holes in said third dielectric layer are in alignment with selective through-holes in said second dielectric layer and in said first dielectric layer so as to cause the electrically conductive paste in said aligned through-holes to come into electrically conductive communication with each other.

5. A method as claimed in claim 4, wherein a fourth dielectric layer has at least one through-hole drilled therein; comprising filling said at least one through-hole with an electrically conductive paste; and laminating said fourth dielectric layer to a surface of said third dielectric layer distal from said second dielectric layer, whereby said at least one through hole is in alignment with a through-hole in at least said third dielectric layer so as to cause the electrically conductive paste in said aligned through-hole to come into electrically conductive communication.

6. A method as claimed in claim 5, wherein said at least one through-hole in said fourth dielectric layer is in electrically conductive alignment with through-holes in said second and first layers.

7. A method as claimed in claim 5, wherein further dielectric layers having through-holes each filled with electrically conductive paste are laminated to said preceding dielectric layers so as to form a printed wiring board structure having a larger multiplicity of dielectric layer with mutually aligned through-holes providing interfacial electrical connects.

8. A method as claimed in claim 1, wherein said conductive paste is selected from the groups of materials consisting of copper, silver, tin, gold and palladium.

9. A method as claimed in claim 1, wherein said filled holes have walls to which metallization is applied throughout along the hole walls.

10. A method as claimed in claim 1, wherein said first dielectric layer is coated with a conductive paste.

11. A method as claimed in claim 10, wherein said electrically conductive paste is filled into said through-holes by forcing the conductive material coated over said first dielectric layer into said through-holes during said laminating.

12. A method as claimed in claim 10, wherein said coating of the first dielectric layer is selectively implemented with or without a mask.

13. A method of producing a laminated multilayer printed wiring board formed from a plurality of individual layers each comprised of a dielectric material so as to form z-axis electrical interconnections; said method comprising:

drilling through-holes in a predetermined array in a first said dielectric layer;

filling said through-holes with an electrically conductive paste;

drilling through-holes in a second array in at least a second said dielectric layer;

filling said through-holes in said second dielectric layer with an electrically conductive paste;

and laminating said first and second dielectric layers with an epoxy-fiberglass material in superimposed surface contact whereby at least selective of the through-holes in said first dielectric layer are in alignment with selective of the through-holes in said second dielectric layer so as to cause the electrically conductive paste in said aligned holes to come into electrically conductive communication with each other.

14. A method as claimed in claim 13, wherein said filled holes have a conductive adhesive applied thereon prior to lamination.

15. A method as claimed in claim 14, wherein said conductive adhesive prior to lamination thereof is applied by stenciling or screening.

16. A method as claimed in claim 13, wherein material for implementing said lamination has a preformed hole pattern matching that of the layers.

17. Method of producing a laminated multilayer printed wiring board formed from a plurality of individual layers each comprised of a dielectric material so as to form z-axis electrical interconnections; said method comprising:

drilling through-holes in a predetermined array in a first said dielectric layer;

filling said through-holes with an electrically conductive paste;

drilling through-holes in a second array in at least a second said dielectric layer;

filling said through-holes in said second dielectric layer with an electrically conductive paste;

and laminating said first and second dielectric layers with a non-reinforced epoxy or photoimagable material in superimposed surface contact whereby at least selective of the through-holes in said first dielectric layer are in alignment with selective of the through-holes in said second dielectric layer so as to cause the electrically conductive paste in said aligned holes to come into electrically conductive communication with each other.

18. A method as claimed in claim 17, wherein said filled holes have a conductive adhesive applied thereon prior to lamination.

19. A method as claimed in claim 18, wherein said conductive adhesive prior to lamination thereof is applied by stenciling or screening.

20. A method as claimed in claim 17, wherein material for implementing said lamination has a preformed hole pattern matching that of the layers.

21. A method of producing a laminated multilayer printed wiring board formed from a plurality of individual layers each comprised of a dielectric material so as to form z-axis electrical interconnections; said method comprising:

drilling through-holes in a predetermined array in a first said dielectric layer;

filling said through-holes with an electrically conductive paste;

drilling through-boles in a second array in at least a second said dielectric layer;

filling said through-holes in said second dielectric layer with an electrically conductive paste, said filled holes being devoid of metallization throughout the hole walls;

and laminating said first and second dielectric layers in superimposed surface contact whereby at least selective of the through-holes in said first dielectric layer are in alignment with selective of the through-holes in said second dielectric layer so as to cause the electrically conductive paste in said aligned holes to come into electrically conductive communication with each other.

22. A method as claimed in claim 21, wherein said filled through-holes have a metallization layer over the paste filler material substantially creating a cap.

23. A method as claimed in claim 21, wherein said filled through-holes are devoid of metallization layer over the paste filler material.

24. A laminated multilayer printed wiring board formed from a plurality of individual layers each constituted of a dielectric organic material so as to form z-axis electrical interconnections comprising:

a first said dielectric layer having an array of through-holes each filled with an electrically conductive paste;

a second said dielectric layer having a second array of through-holes filled with an electrically conductive paste; and said first and second dielectric layers being laminated in superimposed surface contact whereby at least selective of the through-holes in said first dielectric layer are in alignment with selective of the through-holes in said second dielectric layer so as to cause the electrically conductive paste in said aligned holes to come into electrically conductive communication with each other.

25. A printed wiring board as claimed in claim 24, wherein the number and array of holes in said first dielectric layer differs from the number and array of holes in said second dielectric layer.

26. A printed wiring board as claimed in claim 25, wherein said second dielectric layer has fewer through-holes than said first dielectric layer.

27. A printed wiring board as claimed in claim 24, wherein a third dielectric layer has a number of through-holes drilled therein in a specified array; comprising filling said through-holes with an electrically conductive paste; and laminating said third dielectric layer to a surface of said second dielectric layer distal from said first dielectric layer, whereby at least specified of the through-holes in said third dielectric layer are in alignment with selective through-holes in said second dielectric layer and in said first dielectric layer so as to cause the electrically conductive paste in said aligned through-holes to come into electrically conductive communication with each other.

28. A printed wiring board as claimed in claim 27, wherein a fourth dielectric layer has at least one through-hole drilled therein; comprising filling said at least one through-hole with an electrically conductive paste; and laminating said fourth dielectric layer to a surface of said third dielectric layer distal from said second dielectric layer, whereby said at least one through hole is in alignment with a through-hole in at least said third dielectric layer so as to cause the electrically conductive paste in said aligned through-hole to come into electrically conductive communication.

29. A printed wiring board as claimed in claim 28, wherein said at least one through-hole in said fourth dielectric layer is in electrically conductive alignment with through-holes in said second and first dielectric layers.

30. A printed wiring board as claimed in claim 28, wherein further dielectric layers having through-holes each filled with electrically conductive paste are laminated to said preceding dielectric layers so as to form a printed wiring board structure having a larger multiplicity of dielectric layers with mutually aligned through-holes providing interfacial electrical connects.

31. A printed wiring board as claimed in claim 24, wherein said conductive paste is selected from the group of materials consisting of copper, gold and diamond dust.

32. A printed wiring board as claimed in claim 24, wherein said filled holes are provided with a metallization throughout along the walls of the holes.

33. A laminated multilayer printed wiring board formed from a plurality of individual layers each constituted of a dielectric material so as to form z-axis electrical interconnections; comprising:

a first dielectric layer having an array of through-holes each filled with an electrically conductive paste;

a second dielectric layer having a second array of through-holes filled with an electrically conductive paste; and said first and second dielectric layers being laminated with an epoxy-fiberglass material in superimposed surface contact whereby at least selective of the through-holes in said first dielectric layer are in alignment with selective of the through-holes in said second dielectric layer so as to cause the electrically conductive paste in said aligned holes to come into electrically conductive communication with each other.

34. A printed wiring board as claimed in claim 33, wherein said filled holes have a conductive adhesive applied thereon prior to lamination.

35. A printed wiring board as claimed in claim 33, wherein said conductive adhesive is applied prior to lamination, stenciling or screening.

36. A printed wiring board as claimed in claim 33, wherein said lamination material is provided with a preformed hole pattern matching that of the dielectric layers.

37. A laminated multilayer printed wiring board formed from a plurality of individual layers each constituted of a dielectric material so as to form z-axis electrical interconnections; comprising:

a first dielectric layer having an array of through-holes each filled with an electrically conductive paste;

a second dielectric layer having a second array of through-holes filled with an electrically conductive paste; and said first and second dielectric layers being laminated together with a non-reinforced epoxy or photoimagable material in superimposed surface contact whereby at least selective of the through-holes in said first dielectric layer are in alignment with selective of the through-holes in said second dielectric layer so as to cause the electrically conductive paste in said aligned holes to come into electrically conductive communication with each other.

38. A printed wiring board as claimed in claim 37, wherein said filled holes have a conductive adhesive applied thereon prior to lamination.

39. A printed wiring board as claimed in claim 37, wherein said conductive adhesive is applied prior to lamination, stenciling or screening.

40. A printed wiring board as claimed in claim 37, wherein said lamination material is provided with a preformed hole pattern matching that of the dielectric layers.

41. A laminated multilayer printed wiring board formed from a plurality of individual layers each constituted of a dielectric material so as to form z-axis electrical interconnections; comprising:

a first dielectric layer having an array of through-holes each filled with an electrically conductive paste;

a second dielectric layer having a second array of through-holes filled with an electrically conductive paste, said filled holes being devoid of metallization along the walls of the holes; and said first and second dielectric layers being laminated in superimposed surface contact whereby at least selective of the through-holes in said first dielectric layer are in alignment with selective of the through-holes in said second dielectric layer so as to cause the electrically conductive paste in said aligned holes to come into electrically conductive communication with each other.

42. A printed wiring board as claimed in claim 41, wherein said filled holes have a metallization layer applied over the paste filler material substantially creating a cap.

43. A printed wiring board as claimed in claim 41, wherein said filled holes are devoid of a metallization layer over the paste filler material.

44. A laminated multilayer printed wiring board formed from a plurality of individual layers each constituted of a dielectric material so as to form z-axis electrical interconnections comprising:

a first dielectric layer having an array of through-holes each filled with an electrically non-conductive paste, said paste being selected from the group of materials consisting of copper, silver, tin, gold, palladium, and a resinous material;

a second dielectric layer having a second array of through-holes filled with said electrically non-conductive paste; and said first and second layers being laminated in superimposed surface contact whereby at least selective of the through-holes in said first layer are in alignment with selective of the through-holes in said second layer.

45. A printed wiring board as claimed in claim 44, wherein said filled holes have a metallization layer applied over the paste filler material substantially creating a cap.

* * * * *